(12) United States Patent
Hsiao et al.

(10) Patent No.: US 11,121,618 B2
(45) Date of Patent: Sep. 14, 2021

(54) POWER SWITCHING CIRCUIT

(71) Applicant: uPI Semiconductor Corp., Hsinchu County (TW)

(72) Inventors: Chih-Wen Hsiao, Hsinchu County (TW); Wen-Chieh Tsai, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 74 days.

(21) Appl. No.: 16/699,086

(22) Filed: Nov. 28, 2019

(65) Prior Publication Data
US 2020/0304013 A1     Sep. 24, 2020

(30) Foreign Application Priority Data

Mar. 20, 2019  (CN) .......................... 201920356361.8

(51) Int. Cl.
*H02M 1/08* (2006.01)
*H03K 17/082* (2006.01)
*H02M 3/156* (2006.01)

(52) U.S. Cl.
CPC ............. *H02M 1/08* (2013.01); *H02M 3/156* (2013.01); *H03K 17/0828* (2013.01)

(58) Field of Classification Search
CPC .......... H02M 1/08; H02M 1/088; H02M 1/38; H02M 2001/1385; H02M 1/156; H02M 3/157; H02M 3/158; H03K 17/0822; H03K 17/0828; H03K 17/162; H03K 17/165; H03K 17/693; H03K 19/099
See application file for complete search history.

(56) References Cited

U.S. PATENT DOCUMENTS

| | | | |
|---|---|---|---|
| 7,848,125 B2 | 12/2010 | Miller | |
| 8,742,745 B2* | 6/2014 | Huang | H02M 1/44 323/285 |
| 9,331,571 B2* | 5/2016 | Hsiao | H02M 3/156 |
| 9,979,294 B1* | 5/2018 | Harriman | H02M 3/1588 |
| 10,103,727 B1 | 10/2018 | Hsiao et al. | |
| 10,367,417 B1* | 7/2019 | Yazdi | H02M 1/08 |
| 2015/0263620 A1* | 9/2015 | Huang | H03K 17/162 323/271 |
| 2015/0303685 A1* | 10/2015 | Wang | H02M 1/32 323/271 |
| 2017/0302178 A1* | 10/2017 | Bandyopadhyay | H02M 3/1588 |
| 2018/0323696 A1* | 11/2018 | Gammie | H02M 1/38 |
| 2018/0337598 A1* | 11/2018 | Hsiao | H02M 1/44 |

(Continued)

*Primary Examiner* — Matthew V Nguyen
(74) *Attorney, Agent, or Firm* — JCIPRNET

(57) ABSTRACT

The disclosure provides a power switching circuit. The power switching circuit includes a driving circuit, a determining circuit, a first power switch, and a second power switch. The driving circuit outputs a first driving signal and a second driving signal. The determining circuit is coupled to the driving circuit and outputs a control signal to the driving circuit. The first power switch is coupled to a first input voltage and receives the first driving signal. The second power switch is coupled to a second input voltage and receives the second driving signal. When the first power switch and the second power switch are switched, the second driving signal rises from a first level to a preset level, and the determining circuit controls the driving circuit to utilize the first driving signal to turn off the first power switch.

6 Claims, 4 Drawing Sheets

(56) References Cited

U.S. PATENT DOCUMENTS

2019/0260292 A1\* 8/2019 Tajima .................... H02M 1/15
2020/0366182 A1\* 11/2020 Bieber ................... H03K 17/14

\* cited by examiner

POWER SWITCHING CIRCUIT

CROSS REFERENCE TO RELATED APPLICATION

This application claims the priority benefits of China application serial no. 201920356361.8, filed on Mar. 20, 2019. The entirety of the above-mentioned patent application is hereby incorporated by reference herein and made a part of specification.

BACKGROUND

Field of the Disclosure

The disclosure relates to a switching circuit, in particular to a power switching circuit.

Description of Related Art

In the field of power supply applications, generally a power switching method for supplying a plurality of different voltage levels is performed by switching a plurality of power switches so as to selectively turn on one of the plurality of different voltage levels and output the voltage signal of the specific voltage level. However, during the power switching process, dead time often occurs during the time when the switching between the two power switches is turned on and off or when the two power switches are simultaneously turned on, which causes that the outputted voltage signal often shows obvious and sudden voltage drop or cause occurrence of shoot through, leading to that the load or low voltage power supply terminal is burnt. Therefore, several embodiments of the solution will be presented below to address the issue of how to stabilize the power switching effect.

SUMMARY OF THE DISCLOSURE

The disclosure provides a power switching circuit capable of providing a stable power switching effect.

The power switching circuit of the present disclosure includes a driving circuit, a determining circuit, a first power switch, and a second power switch. The driving circuit outputs a first driving signal and a second driving signal. The determining circuit is coupled to the driving circuit and outputs a control signal to the driving circuit. The first power switch is coupled to a first input voltage and receives the first driving signal. The second power switch is coupled to a second input voltage and receives the second driving signal. When the first power switch and the second power switch are switched, the second driving signal rises from a first level to a preset level, and the determining circuit controls the driving circuit to utilize the first driving signal to turn off the first power switch.

In an embodiment, the determining circuit includes a sensing circuit and a dead time control circuit.

According to an embodiment of the disclosure, the sensing circuit includes a driving signal selector and a comparator, and the driving signal selector receives the first driving signal and the second driving signal, the first input terminal of the comparator is coupled to the driving signal selector, and the second input terminal of the comparator is coupled to the preset voltage.

In an embodiment of the disclosure, the dead time control circuit includes: a flip-flop having a first input terminal receiving a switching signal, a reset terminal thereof receiving a sensing signal outputted by the sensing circuit, a second input terminal thereof receiving another switching signal, a first output terminal thereof outputting a first output signal, a second output terminal thereof outputting a second output signal; a first OR gate having a first input terminal receiving the another switching signal, a second input terminal thereof coupled to the first output terminal of the flip-flop, an output terminal thereof outputting a first control signal; and a second OR gate having a first input terminal coupled to the second output terminal of the flip-flop, a second input terminal thereof receives the switching signal, and an output terminal thereof outputting a second control signal.

In an embodiment, the dead time control circuit further includes: an inverter, an input terminal thereof receives the switching signal, and an output terminal thereof outputs another switching signal.

In an embodiment of the disclosure, when the second driving signal rises from the first level to the preset level, the determining circuit controls the driving circuit to turn on the second power switch through the second driving signal.

In an embodiment of the disclosure, the first power switch and the second power switch are coupled to an output terminal of the power switching circuit, and one of the first power switch and the second power switch supplies an output voltage to the output terminal after being turned on.

In an embodiment of the disclosure, the second input voltage and the first input voltage are different voltage levels.

Based on the above, the power switching circuit of the present disclosure can timely control the switch of the power switch by determining the level change of the driving signal through the determining circuit to provide a stable power switching effect.

In order to make the aforementioned features and advantages of the disclosure more comprehensible, embodiments accompanying figures are described in detail below.

DESCRIPTION OF EMBODIMENTS

Figure 1:
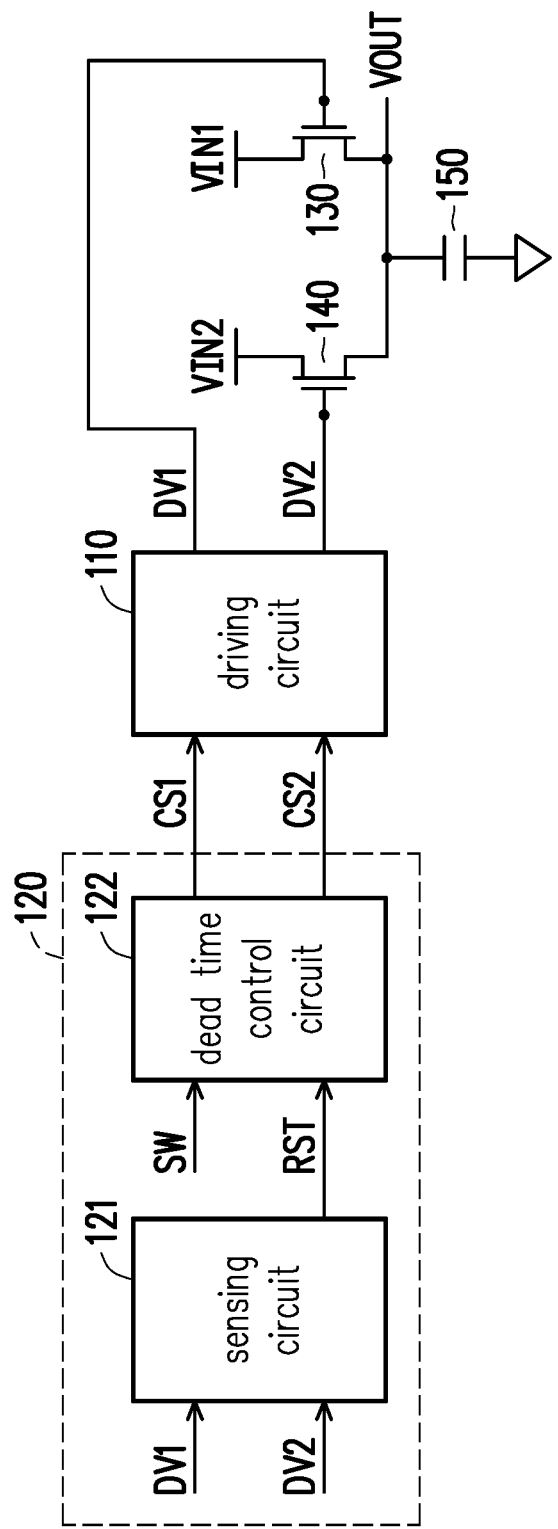
FIG. 1 is a schematic diagram of a power switching circuit according to an embodiment of the present disclosure.

In order to make the content of the present disclosure more comprehensible, the following specific embodiments are provided to serve as examples based on which the present disclosure can actually be implemented. In addition, wherever possible, the elements/components/steps denoted by the same reference numerals in the drawings and embodiments represent the same or similar components.

FIG. 1 is a schematic diagram of a power switching circuit according to an embodiment of the present disclosure. The power switching circuit 100 includes a driving circuit 110, a determining circuit 120, a first power switch 130, and a second power switch 140. In the embodiment, the determining circuit 120 is coupled to the driving circuit 110, and outputs the first control signal CS1 and the second control signal CS2 to the driving circuit 110. The driving circuit 110 is coupled to the first power switch 130 and the control terminal of the second power switch 140, and controls the switching states of the first power switch 130 and the second power switch 140 according to the first control signal CS1 and the second control signal CS2. In this embodiment, the first terminal of the first power switch 130 is coupled to the first input voltage VIN1, and the first terminal of the second power switch 140 is coupled to the second input voltage VIN2. The second terminal of the first power switch 130 and the second power switch 140 are coupled to the output terminal and a capacitor 150, and the output terminal outputs the output voltage VOUT.

In the embodiment, the driving circuit 110 outputs the first driving signal DV1 and the second driving signal DV2 to the control terminals of the first power switch 130 and the second power switch 140 according to the first control signal CS1 and the second control signal CS2. In the embodiment, the determining circuit 120 includes a sensing circuit 121 and a dead time control circuit 122. The sensing circuit 121 is coupled to the dead time control circuit 122 and respectively senses the two voltage output terminals of the driving circuit 110 to obtain the first driving signal DV1 and the second driving signal DV2, but the disclosure is not limited thereto. In an embodiment, the sensing circuit 121 may also respectively sense voltage signals of the first terminal or the second terminal of the first power switch 130 and the second power switch 140.

In this embodiment, the sensing circuit 121 generates a reset signal RST according to the first driving signal DV1 and the second driving signal DV2. The dead time control circuit 122 is coupled to the sensing circuit 121 to receive the reset signal RST. Moreover, the dead time control circuit 122 further receives the switching signal SW provided externally. In this embodiment, when the dead time control circuit 122 receives the switching signal RST, the dead time control circuit 122 gradually boots or lowers the first driving signal DV1 or the second driving signal DV2 through the first control signal CS1 or the second control signal CS2. Moreover, when the sensing circuit 121 senses that one of the first driving signal DV1 and the second driving signal DV2 is adjusted to the preset level, the sensing circuit 121, through the reset signal RST, makes the dead time control circuit 122 to switch the switching state of the other one of the first power switch 130 and the second power switch 140 through the other one of the first control signal CS1 and the second control signal CS2, such that the output voltage VOUT of the output terminal can present a stable voltage level change.

Figure 2:
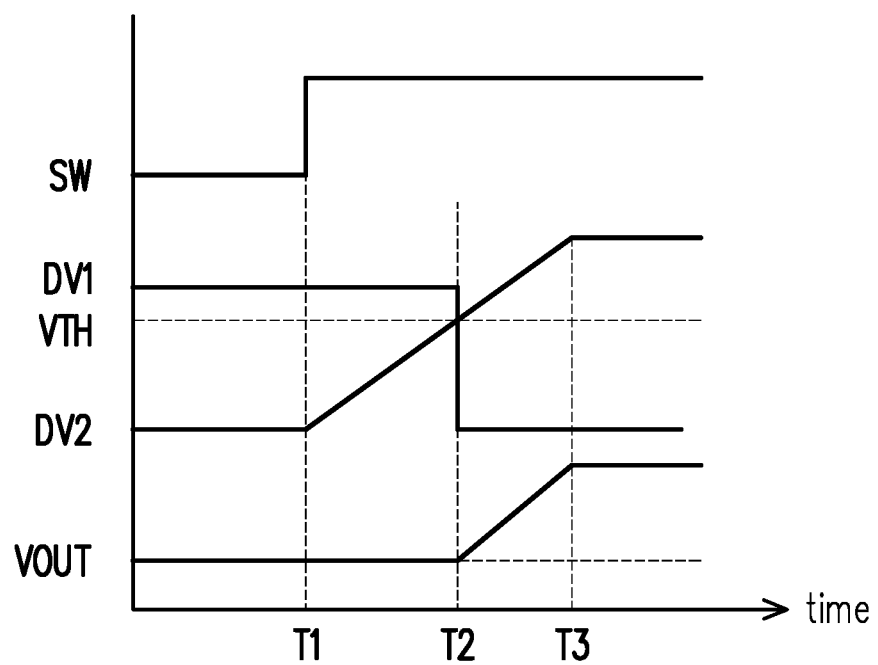
FIG. 2 is a waveform timing diagram according to an embodiment of the present disclosure.

FIG. 2 is a waveform timing diagram according to an embodiment of the present disclosure. Referring to FIG. 1 and FIG. 2, the signal waveform in FIG. 2 is one of the power switching examples of the power switching circuit 100 in FIG. 1. In this embodiment, it is assumed that the first power switch 130 of the power switching circuit 100 is turned on, and the second power switch 140 of the power switching circuit 100 is turned off. The output voltage VOUT at the output terminal of the power switching circuit 100 is determined by the first power switch 130 according to the first input voltage VIN1 and the first control signal CS1 (the voltage level of the output voltage VOUT is equal to, for example, the first input voltage VIN1). When the switching signal SW is switched from the low voltage level to the high voltage level via external control, the dead time control circuit 122 starts to gradually boot the voltage level of the second driving signal DV2 from the time point T1.

Moreover, at the time point T2, when the voltage level of the second driving signal DV2 rises from the first level to the preset level VTH, the sensing circuit 121 outputs the reset signal RST to the dead time control circuit 122, such that the dead time control circuit 122 turns off the first power switch 130 through the first control signal CS1. In this embodiment, the preset level VTH may be a threshold voltage of the first power switch 130 or the second power switch 140 plus the current output voltage VOUT. Under the circumstances, the output voltage VOUT at the output terminal of the power switching circuit 100 is still a voltage signal of the same voltage level, but the output voltage VOUT at the output terminal of the power switching circuit 100 is determined through the second power switch 140 according to the second control signal CS2 and the second input voltage VIN2. Then, as the dead time control circuit 122 continuously boots the second driving signal DV2, the output voltage VOUT at the output terminal of the power switching circuit 100 will reach the highest output voltage level at the time point T3 (the voltage level of the output voltage VOUT is, for example, equal to the second input voltage VIN2). Therefore, the power switching circuit 100 of the embodiment can provide a power switching effect with stable voltage level change.

In addition, in an embodiment, the second input voltage and the first input voltage are different voltage levels, the first input voltage VIN1 is, for example, 3.3 volts (V), and the second input voltage VIN2 is, for example, 12 volts, but the disclosure is not limited thereto.

Figure 3:
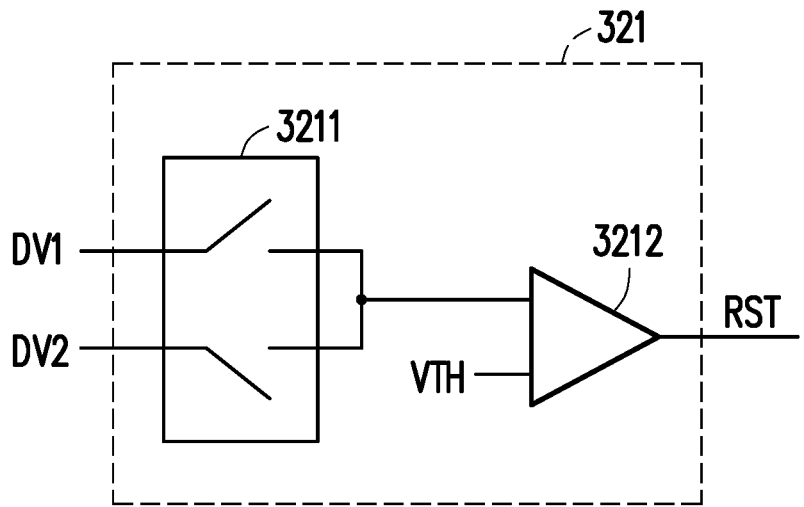
FIG. 3 is a schematic diagram of a sensing circuit according to an embodiment of the present disclosure.

FIG. 3 is a schematic diagram of a sensing circuit according to an embodiment of the present disclosure. Referring to FIG. 3, the sensing circuit 321 shown in FIG. 3 may be one of the examples of the embodiments of the present disclosure. In the embodiment, the sensing circuit 321 includes a driving signal selector 3211 and a comparator 3212. The driving signal selector 3211 includes a first switch component and a second switch component. The driving signal selector 3211 is configured to receive the first driving signal DV1 and the second driving signal DV2, and is configured to selectively switch the first switching component and the second switching component to output one of the first driving signal DV1 and the second driving signal DV2 to the comparator 3212. In the embodiment, the first terminal of the comparator 3212 is coupled to the driving signal selector 3211, and receives one of the first driving signal DV1 and the second driving signal DV2. The second terminal of the comparator 3212 is coupled to the preset voltage VTH. In this embodiment, the output terminal of the comparator 3212 outputs the reset signal RST according to a comparison result of one of the first driving signal DV1 and the second driving signal DV2 and the preset voltage VTH.

Figure 4:
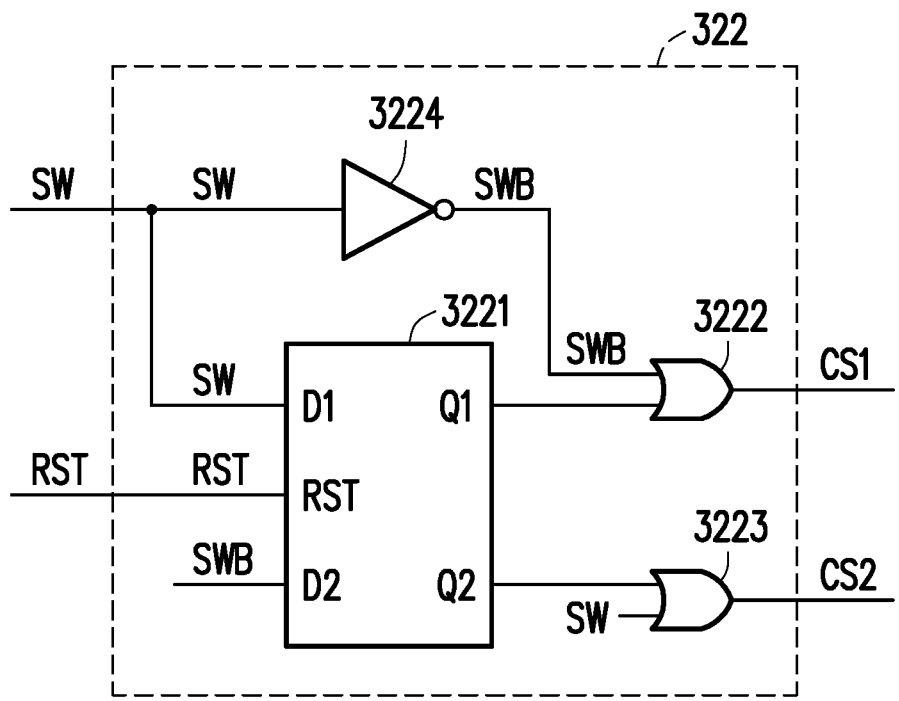
FIG. 4 is a schematic diagram of a dead time control circuit according to an embodiment of the present disclosure.

FIG. 4 is a schematic diagram of a dead time control circuit according to an embodiment of the present disclosure. Referring to FIG. 4, the dead time control circuit 322 shown in FIG. 4 may be one of the examples of the embodiments of the present disclosure. In the present embodiment, the dead time control circuit 322 includes a flip-flop 3221, a first OR gate 3222, a second OR gate 3223, and an inverter 3224. The first input terminal (D1) of the flip-flop 3221 receives the switching signal SW, and the second input terminal (D2) of the flip-flop 3221 receives another switching signal SWB. The reset terminal (RST) of the flip-flop 3221 receives the sensing signal RST outputted by the sensing circuit. The first output terminal (Q1) of the flip-flop 3221 outputs a first output signal, and the second output terminal (Q2) of the flip-flop 3221 outputs a second output signal. The output terminal of the inverter 3224 receives the switching signal SW, and the output terminal outputs another switching signal SWB. The other switching signal SWB is the inversion of the switching signal SW.

In the embodiment, the first input terminal of the first OR gate 3222 receives another switching signal SWB, and the second input terminal of the first OR gate 3222 is coupled to the first output terminal of the flip-flop 3221 to receive the first output signal. The first input terminal of the second OR gate 3223 is coupled to the second output terminal of the flip-flop 3221 to receive the second output signal, and the second input terminal of the second OR gate 3223 receives the switching signal SW. In the present embodiment, the first OR gate 3222 outputs the first control signal CS1 through the output terminal of the first OR gate 3222 according to the other switching signal SWB and the first output signal, and the second OR gate 3223 outputs the second control signal CS2 through the output terminal of the second OR gate 3223 according to the second output signal and the switching signal SW.

Figure 5:
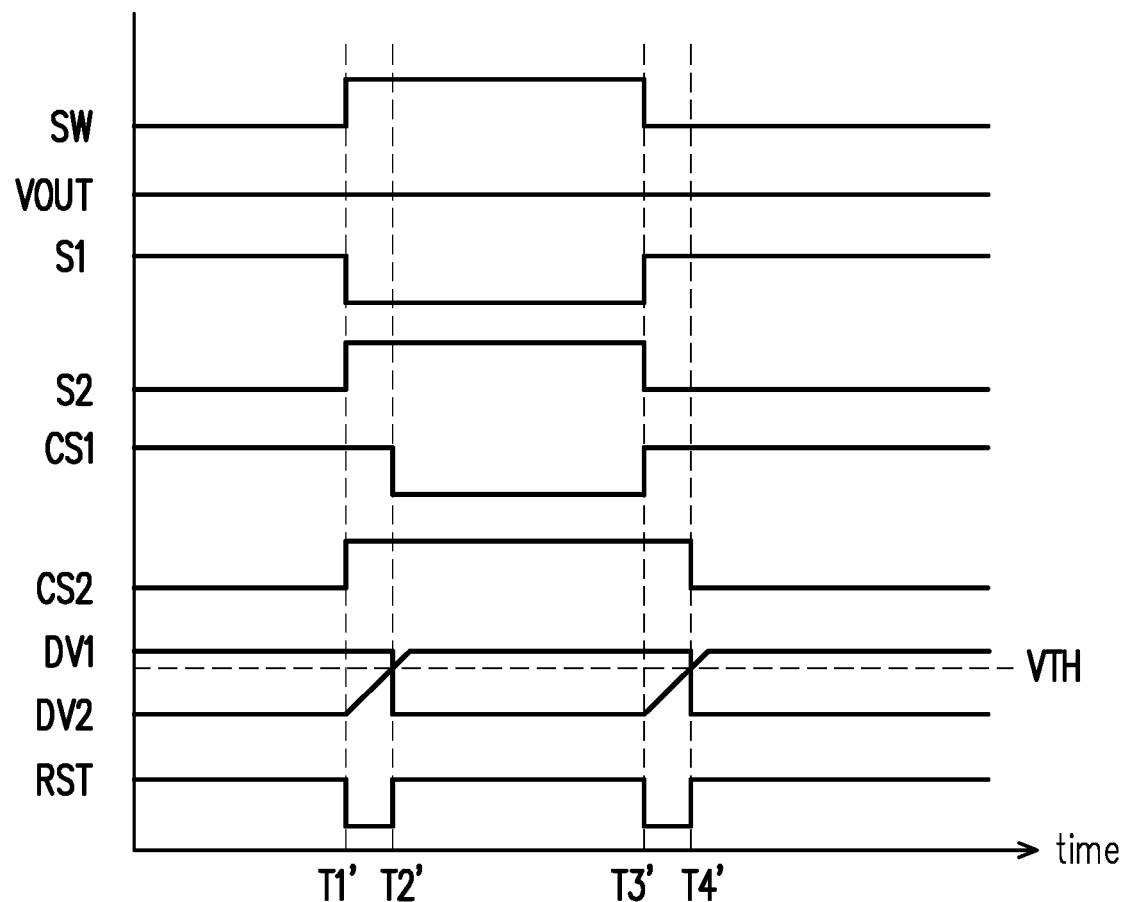
FIG. 5 is a waveform timing diagram according to another embodiment of the present disclosure.

FIG. 5 is a waveform timing diagram according to another embodiment of the present disclosure. Referring to FIG. 1, FIG. 3, FIG. 4 and FIG. 5, the signal waveform in FIG. 5 is one of the power switching examples based on the power switching circuit 100 in FIG. 1 combined with the sensing circuit 321 in FIG. 3 and the dead time control circuit 322 in FIG. 4. In the following embodiment, the sensing circuit 121 in FIG. 1 is replaced by the sensing circuit 321 in FIG. 3 for description, and the dead time control circuit 122 in FIG. 1 is also replaced by the dead time control circuit 322 in FIG. 4 for description. In this embodiment, before the time point T1', the first power switch 130 is turned on, and the second power switch 140 is turned off. The first driving signal DV1 is at a high voltage level, and the second driving signal DV2 is at a low voltage level. Therefore, the first power switch 130 provides a voltage signal to the output terminal of the power switching circuit 100 according to the first input voltage VIN1 of the first power supply.

At the time point T1', when the switching signal SW externally inputted to the dead time control circuit 322 is switched from the low voltage level to the high voltage level, the sensing circuit 321 turns off the first switching component (for example, the switching control signal S1 is switched from a high voltage level to a low voltage level) and the second switching component is turned on (for example, the switching control signal S2 is switched from a low voltage level to a high voltage level), such that the comparator 3212 outputs the reset signal RST according to the second driving signal DV2 and the preset voltage VTH. In this embodiment, the preset level VTH may be a threshold voltage of the first power switch 130 or the second power switch 140 plus the current output voltage VOUT, and the reset signal RST is switched from the high voltage level to the low voltage level. Therefore, the dead time control circuit 322 switches the second control signal CS2 from the low voltage level to the high voltage level according to the switching signal SW and the reset signal RST, and the first control signal CS1 maintains at the high voltage level, such that the driving circuit 110 starts to gradually boot the second driving signal DV2. Between the time point T1' and the time point T2', the second power switch 140 has not been turned on, so the output voltage VOUT at the output terminal of the power switching circuit 100 is still supplied by the first power switch 130 according to the first input voltage VIN1 of the first power supply. From another point of view, the time interval between the time point T1' and the time point T2' is a buffering interval in the process of switching power supply, and the purpose of which is to reduce or avoid the possibility that the situation of dead time is occurred to the first power switch 130 and the second power switch 140 of the power switching circuit 100 in the time interval between the time point T1' and the time point T2'.

At the time point T2', when the voltage level of the second driving signal DV2 rises from the first level to the voltage level of the preset voltage VTH, the reset signal RST is now switched back to the high voltage level from the low voltage level. Moreover, the dead time control circuit 322 switches the first control signal CS1 from the high voltage level to the low voltage level according to the switching signal SW and the reset signal RST, and the second control signal CS2 maintains at the high voltage level, such that the driving circuit 110 continuously boots the second driving signal DV2. In other words, after the time point T2', the second power switch 140 is turned on, and the first power switch 130 is turned off. Therefore, the output voltage VOUT at the output terminal of the power switching circuit 100 will be provided by the second power switch 140 instead according to the second input voltage VIN2 of the second power supply. Accordingly, it is possible to effectively prevent the output voltage VOUT at the output terminal of the power switching circuit 100 of the present embodiment from being obviously and suddenly dropped by reducing or eliminating the influence brought by the dead time in the power switching process.

Likewise, it can be inferred from the signal change at the time point T1' and the time point T2' that the switching process at the time points T3' and T4' has similar power switching operation and the signal change, and therefore related descriptions are not repeated herein. In addition, it should be mentioned that the first input voltage VIN1 in this embodiment is, for example, 3.3 volts, and the second input voltage VIN2 is, for example, 3 volts. Therefore, the voltage level change of the output voltage VOUT in this embodiment is relatively moderate as compared with the waveform timing diagram shown in FIG. 2. However, the disclosure provides no limitation to the voltage levels of the first input voltage VIN1 and the second input voltage VIN2.

In summary, the power switching circuit of the present disclosure, in response to the voltage level change result of the driving signal, can timely control the switching state of the power switch through the sensing circuit and the dead time control circuit, thereby effectively reducing or eliminating the influence brought by dead time and providing a stable output voltage switching effect.

Finally, it should be noted that the above embodiments are merely illustrative of the technical solutions of the present disclosure, and are not intended to be limiting. Although the present disclosure has been described in detail with reference to the foregoing embodiments, those skilled in the art will understand that the technical solutions described in the foregoing embodiments may be modified, or some or all of the technical features may be equivalently replaced; and the modifications or substitutions do not deviate the nature of corresponding technical solutions from the scope of the embodiments of the present disclosure.

What is claimed is:

1. A power switching circuit, comprising:
   a driving circuit, outputting a first driving signal and a second driving signal;
   a determining circuit, coupled to the driving circuit and outputting a control signal to the driving circuit;
   a first power switch, coupled to a first input voltage and receiving the first driving signal; and
   a second power switch, coupled to a second input voltage and receiving the second driving signal, wherein when the first power switch and the second power switch are switched, the second driving signal rises from a first level to a preset level, and the determining circuit controls the driving circuit to utilize the first driving signal to turn off the first power switch, wherein the determining circuit comprises a sensing circuit and a dead time control circuit, wherein the sensing circuit comprises a driving signal selector and a comparator, the driving signal selector receives the first driving signal and the second driving signal, a first input terminal of the comparator is coupled to the driving signal selector, and a second input terminal of the comparator is coupled to a preset voltage.

2. The power switching circuit of claim 1, wherein the dead time control circuit comprises:

a flip-flop, wherein a first input terminal thereof receives a switching signal, a reset terminal thereof receives a sensing signal outputted by the sensing circuit, a second input terminal thereof receives another switching signal, a first output terminal thereof outputs a first output signal, and a second output terminal thereof outputs a second output signal;

a first OR gate, wherein a first input terminal thereof receives the another switching signal, a second input terminal thereof is coupled to the first output terminal of the flip-flop, and an output terminal thereof outputs a first control signal; and a second OR gate, wherein a first input terminal thereof is coupled to the second output terminal of the flip-flop, a second input terminal thereof receives the switching signal, and an output terminal thereof outputs a second control signal.

3. The power switching circuit of claim 1, wherein the dead time control circuit further comprises:

an inverter, wherein an input terminal thereof receives a switching signal and an output terminal thereof outputs another switching signal.

4. The power switching circuit of claim 1, wherein when the second driving signal rises from the first level to the preset level, the determining circuit controls the driving circuit to turn on the second power switch through the second driving signal.

5. The power switching circuit of claim 1, wherein the first power switch and the second power switch are coupled to an output terminal of the power switching circuit, and one of the first power switch and the second power switch provides an output voltage to the output terminal after being turned on.

6. The power switching circuit of claim 1, wherein the second input voltage and the first input voltage are at different voltage levels.

* * * * *